United States Patent
Zingher et al.

(10) Patent No.: US 7,649,245 B2
(45) Date of Patent: *Jan. 19, 2010

(54) STRUCTURES AND METHODS FOR A FLEXIBLE BRIDGE THAT ENABLES HIGH-BANDWIDTH COMMUNICATION

(75) Inventors: Arthur R. Zingher, Mountain View, CA (US); Bruce M. Guenin, San Diego, CA (US); Ronald Ho, Mountain View, CA (US); Robert J. Drost, Los Altos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 396 days.

This patent is subject to a terminal disclaimer.

(21) Appl. No.: 11/418,985

(22) Filed: May 4, 2006

(65) Prior Publication Data

US 2007/0043894 A1   Feb. 22, 2007

Related U.S. Application Data

(60) Provisional application No. 60/677,585, filed on May 4, 2005, provisional application No. 60/677,621, filed on May 4, 2005.

(51) Int. Cl.
*H01L 39/00* (2006.01)
*H01L 21/00* (2006.01)

(52) U.S. Cl. .......... 257/664; 257/E23.01; 257/E23.079; 257/E23.177; 438/106

(58) Field of Classification Search ................. 430/313; 378/62; 257/668, 778, 664, E23.01, E23.079, 257/E23.177, 784, E23.17, E21.627; 174/84 R; 438/106

See application file for complete search history.

(56) References Cited

U.S. PATENT DOCUMENTS

| 5,225,633 | A | * | 7/1993 | Wigginton | 174/84 R |
|---|---|---|---|---|---|
| 5,744,284 | A | * | 4/1998 | Laub et al. | 430/313 |
| 5,744,859 | A | * | 4/1998 | Ouchida | 257/668 |
| 6,470,071 | B1 | * | 10/2002 | Baertsch et al. | 378/62 |
| 6,869,825 | B2 | * | 3/2005 | Chiu | 438/106 |
| 7,294,827 | B2 | * | 11/2007 | Tan et al. | 250/239 |
| 7,425,760 | B1 | * | 9/2008 | Guenin et al. | 257/698 |

* cited by examiner

*Primary Examiner*—Leonardo Andújar
*Assistant Examiner*—Monica D Harrison
(74) *Attorney, Agent, or Firm*—Park, Vaughan & Fleming LLP

(57) ABSTRACT

One embodiment of the present invention provides a system that facilitates high-bandwidth communication using a flexible bridge. This system includes a chip with an active face upon which active circuitry and signal pads reside, and a second component with a surface upon which active circuitry and/or signal pads reside. A flexible bridge provides high-bandwidth communication between the active face of the chip and the surface of the second component. By matching the wire line size in the flexible bridge to the size of circuits and/or signal pads on the chip and on the second component, the system allows signals to be sent between the circuits on the chip and the second component without having to change the scale of the interconnect, thereby alleviating wireability and bandwidth limitations of conventional chip packaging technologies.

20 Claims, 17 Drawing Sheets

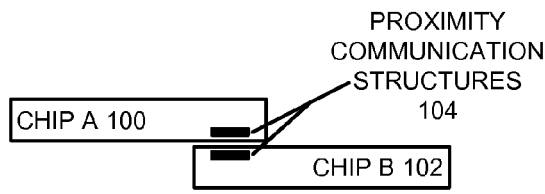
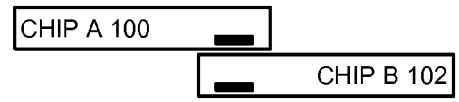
FIG. 1A  FIG. 1B
FIG. 1C  FIG. 1D
FIG. 1E
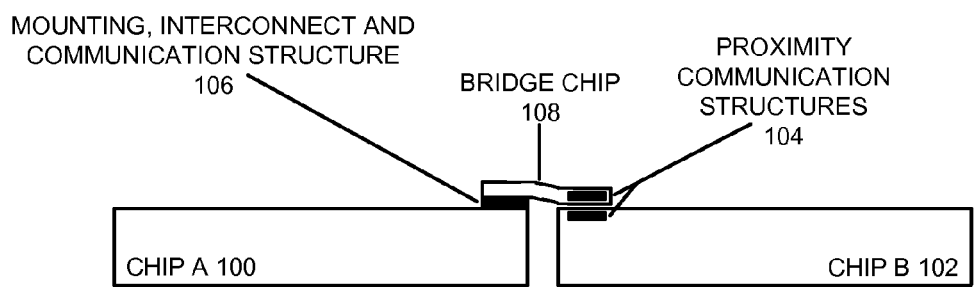
FIG. 1F

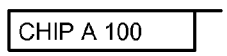  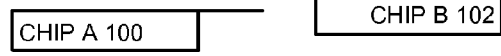
FIG. 2A  FIG. 2B
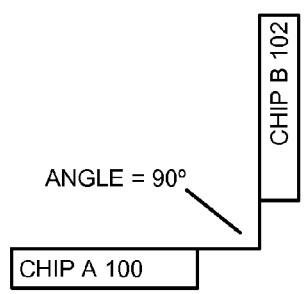 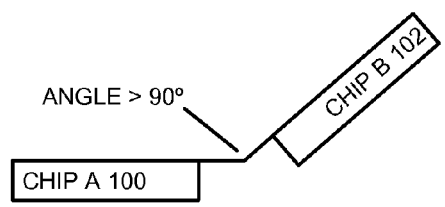
FIG. 2C  FIG. 2D
 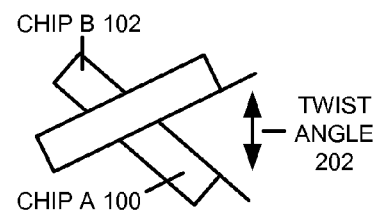
FIG. 2E  FIG. 2F

STRUCTURES AND METHODS FOR A FLEXIBLE BRIDGE THAT ENABLES HIGH-BANDWIDTH COMMUNICATION

RELATED APPLICATION

The subject matter of this application is related to the subject matter in a co-pending non-provisional application by the same inventors as the instant application and filed on the same day as the instant application entitled, "Structures and Methods for the Application of a Flexible Bridge," having Ser. No. 11/418,986, and filing date 4 May 2006. This application also claims priority under 35 U.S.C. §119(e) to U.S. Provisional Application Ser. No. 60/677,585, filed on 4 May 2005, and to U.S. Provisional Application Ser. No. 60/677,621, filed on 4 May 2005, the contents of which are herein incorporated by reference.

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention generally relates to semiconductor integrated circuits. More specifically, the present invention relates to structures and methods associated with a flexible bridge that enables high-bandwidth communication to a chip while simplifying chip alignment.

2. Related Art

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, the first chip can transmit data signals directly to the second chip without having to route the data signals through intervening signal lines within a printed circuit board.

This capacitive communication technique can greatly increase the communication bandwidth between chips. However, this capacitive communication technique depends upon precise alignment. For instance, the effectiveness of capacitive coupling depends on the alignment of the transmitter pads and the receiver pads, both in a plane defined by the pads and in a direction perpendicular to the plane. Sub-optimal alignment can result in poor communication performance between chips and increased power consumption. Unfortunately, aligning chips properly using existing mounting structures, such as conventional single-chip modules or conventional multi-chip modules, is not a simple matter. The chips in these structures are subject to thermal expansion and mechanical vibrations, as well as manufacturing and assembly perturbations that cause alignment problems. Furthermore, a need to deliver power and cooling to chips that communicate through proximity communication further complicates chip alignment.

Hence, what is needed are structures and methods that allow high-bandwidth communication between chips without the above-described problems.

SUMMARY

One embodiment of the present invention provides a system that facilitates high-bandwidth communication using a flexible bridge. This system includes a chip with an active face upon which active circuitry and signal pads reside, and a second component with a surface upon which active circuitry and/or signal pads reside. A flexible bridge provides high-bandwidth communication between the active face of the chip and the surface of the second component. By matching the wire line size in the flexible bridge to the size of circuits and/or signal pads on the chip and on the second component, the system allows signals to be sent between the circuits on the chip and the second component without having to change the scale of the interconnect, thereby alleviating wireability and bandwidth limitations of conventional chip packaging technologies.

In a variation on this embodiment, the flexible bridge allows the chip to be moved with six degrees of freedom relative to the second component without affecting communication between the chip and second component. Hence, the flexible bridge allows the chip and the second component to communicate without requiring precise alignment between the chip and the second component.

In a variation on this embodiment, the flexible bridge is bonded conductively to the active face of the chip using micro-bumps.

In a variation on this embodiment, the flexible bridge includes a proximity-communication region that provides proximity communication functionality. This proximity-communication region is precisely aligned with a corresponding proximity-communication region on another component.

In a variation on this embodiment, the flexible bridge comprises micro flexible printed writing.

In a variation on this embodiment, the communication density of the flexible bridge is different for the active face of the first chip and the surface of the second component, and the flexible bridge is tapered.

In a variation on this embodiment, an underfill used when mounting the chip to another surface is adjusted to accommodate the flexible bridge. In a further embodiment, adjusting the underfill can include adjusting the underfill to fix the flexible bridge in place.

In a variation on this embodiment, the flexible bridge does not interfere with the cooling system for the chip. In a further embodiment, heat is removed from the flexible bridge by transferring the heat to the chip, to the cooling system, and/or along the flexible bridge.

In a variation on this embodiment, the flexible bridge comprises metal traces on a silicon wafer from which the silicon has been etched away to leave a flexible layer.

In a further variation, the flexible bridge comprises multiple layers of metal traces and/or planes separated by dielectrics. An enhanced thermal conductivity layer and/or plane, for instance an additional metal layer, can be used to assist in heat transfer.

In a variation on this embodiment, the flexible bridge is bonded to additional structures or wires that provide power delivery.

In a variation on this embodiment, the flexible bridge is fabricated using either additive or subtractive processes.

In a further variation, the additive or subtractive processes leave circuit structures on the surface of the flexible bridge.

BRIEF DESCRIPTION OF THE FIGURES

FIG. 1A illustrates proximity communication structures on the surfaces of two chips that allow the two chips to communicate in accordance with an embodiment of the present invention.

FIG. 1B illustrates a configuration of two chips in which the proximity communication penetrates one of the chips in accordance with an embodiment of the present invention.

FIG. 1C illustrates a configuration of two chips in which the proximity communication penetrates both of the chips in accordance with an embodiment of the present invention.

FIG. 1D illustrates two chips placed edge-to-edge with proximity communication structures located on a vertical edge in accordance with an embodiment of the present invention.

FIG. 1E illustrates two chips placed edge-to-edge with proximity communication structures located on a beveled edge in accordance with an embodiment of the present invention.

FIG. 1F illustrates a bridge chip that enables proximity communication between two chips in accordance with an embodiment of the present invention.

FIG. 2A illustrates an orientation in which two chips are coplanar in accordance with an embodiment of the present invention.

FIG. 2B illustrates an orientation in which two chips are parallel but offset in the z-plane in accordance with an embodiment of the present invention.

FIG. 2C illustrates two chips oriented at a right angle in accordance with an embodiment of the present invention.

FIG. 2D illustrates two chips oriented at an angle greater than 90 degrees in accordance with an embodiment of the present invention.

FIG. 2E illustrates a perspective view of two chips twisted with respect to each other in accordance with an embodiment of the present invention.

FIG. 2F illustrates a side view of two chips twisted with respect to each other in accordance with an embodiment of the present invention.

DETAILED DESCRIPTION

Figure 3A:
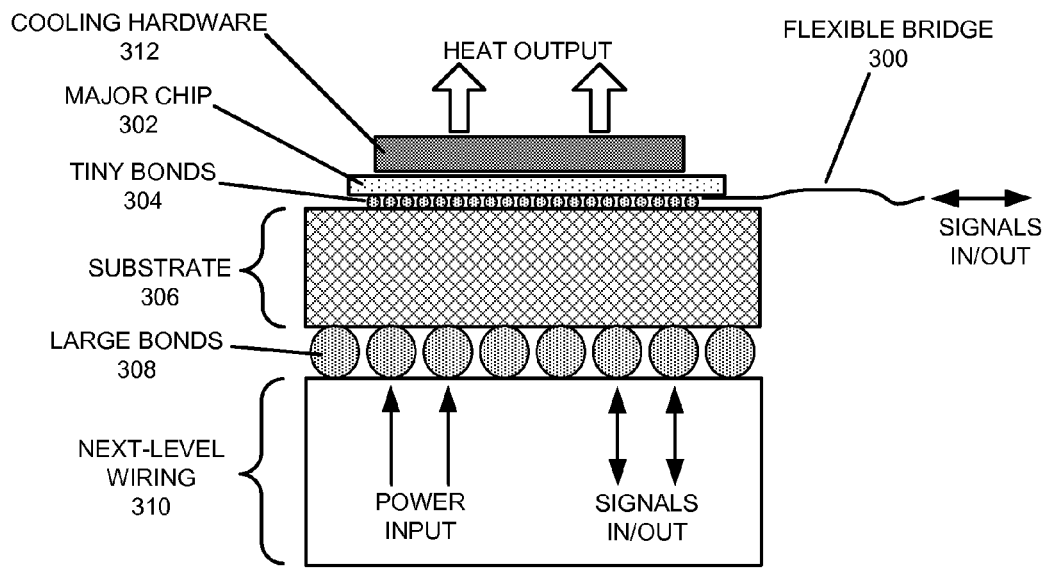
FIG. 3A illustrates a major chip bonded to single-chip module that can communicate through a flexible bridge in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Inter-Chip Bandwidth and Alignment

Chips in electronic systems are often mounted to single-chip modules (SCMs). The chip and SCM are assembled together, and then each SCM undergoes individual burn-in and testing, after which they can be mounted to a printed-wiring board (PWB) or printed-wiring card (PWC). However, while SCMs provide favorable yield with moderate cost, they also present challenges to high-bandwidth communication between chips. For instance, practical constraints in the number of signal wires limit the total bandwidth between the two chips. Furthermore, sending a signal from a chip through the module to the motherboard and to another SCM typically involves changing the scale of the interconnect from a small on-chip scale to a larger wire trace on the module and the motherboard. The SCM serves as a "space transformer" that scales up/down the metal size, depending on the direction of the signal path. Note that such scaling can involve larger conductors, increased total wire length, and a potentially larger fan out, and may increase propagation delays and power consumption. A communication channel that can avoid such scaling and use less energy to transfer signals directly between the two chips is very desirable.

As an alternative, the two chips may instead be bonded upon a multi-chip module (MCM, also known as a plural chip module), which enables high-bandwidth communication. However, the yield of these chips, along with the MCM, is the product of several factors, which often results in a poor overall yield.

"Proximity communication" makes possible direct chip-to-chip communication through capacitive coupling between mating arrays of pads on two closely-adjacent chips. Proximity communication (PxC) typically uses high-density, high-frequency capacitive coupling over a small distance, but can also incorporate inductive coupling, optical coupling, magnetic coupling, and/or spin-tronic coupling. PxC enables extremely large bandwidth and bandwidth per area of an array, and enables large sets of densely-packed integrated circuit (IC) chips with low-latency communication between chips. However, proximity communication depends upon high precision in the alignment of chips, including x-y alignment (parallel to the chips) as well as z-axis alignment (perpendicular to the chips).

Existing designs that use proximity communication between a number of IC chips are typically configured with two closely-overlapping layers of carrier chips oriented face-to-face, for instance with the corners of each chip in one layer either in contact with or proximity to the corners of chips in the opposite layer. FIGS. 1A-1F illustrate a series of possible proximity communication configurations. FIG. 1A illustrates proximity communication structures 104 on the surfaces of chip A 100 and chip B 102 that allow the two chips to communicate. FIG. 1B illustrates a configuration of the two chips in which the proximity communication penetrates chip B 102. FIG. 1C illustrates a configuration in which proximity communication penetrates both chip A 100 and chip B 102. In FIG. 1D and FIG. 1E, the two chips are placed edge-to-edge, with a proximity communication structures located on a vertical edge and beveled edge, respectively.

In typical designs, location constraints may prevent chips from being easily aligned for proximity communication. FIGS. 2A-2F illustrate a range of possible orientations for two chips seeking to communicate. FIG. 2A illustrates a simple orientation in which two chips are coplanar. FIG. 2B illustrates an orientation in which two chips are parallel but offset in the z-plane. FIG. 2C illustrates two chips oriented at a right angle, while FIG. 2D illustrates two chips oriented at an angle greater than 90 degrees. FIGS. 2E and 2F illustrate two chips twisted with respect to each other. FIG. 2E illustrates a perspective view of the two chips, while FIG. 2F illustrates a side view that shows the twist angle 202. In general, constraints may cause two chips to be oriented in six degrees of freedom with respect to one another, which typically complicates high-speed communication between the two chips.

Unfortunately, because SCMs generally provide only coarse alignment between chips on adjacent SCMs, such modules on a PWC are not compatible with existing PxC techniques. High-volume electronics (such as organic circuit boards) also typically flex as they heat and cool during normal operation, resulting in further alignment difficulties. Chips in an MCM may be configured to communicate using a semi-bendable bridge chip that provides PxC functionality, but because of the previously-mentioned low yield, as well as complexity, alignment, and cost issues, such modules are sometimes not viable.

FIG. 1F illustrates a bridge chip 108 that enables proximity communication between two chips. The bridge chip 108 is mounted to chip A 100 using a mounting, interconnect, and communication structure 106, and includes proximity communication structures 104 that allow chip A 100 to communicate with chip B 102. A thin bridge chip 108 can bend slightly to compensate for misalignment in two dimensions (or degrees of freedom), but still provides only a limited solution.

The present invention describes a flexible bridge that provides high-speed communication between two devices while relaxing alignment constraints. The flexible bridge transcends the wireability and bandwidth limits of conventional SCMs, while also transcending the yield problems of a MCM.

Flexible Bridges

In one embodiment of the present invention, a flexible bridge enables PxC to be used with almost standard electronic packaging in a wide variety of electronic systems. For instance, a flexible bridge can enable multiple channels of high-bandwidth communication between two chips while using only a small area on each chip. In a further embodiment, the flexible bridge can be de-mateable and re-mateable with a SCM, thereby allowing each chip module to be independent and almost conventional during fabrication, assembly of the chip upon the SCM, SCM burn-in, SCM test, assembly of the SCM upon the PWB, and replacement of the SCM upon the PWB. Hence, SCMs can be mounted crudely on a PWC and re-mateably linked with large bandwidth density (BWD). Because the SCMs, flexible bridge, and, if used, PxC chips are typically burned-in, tested, and yielded separately, a final combined system can be built from components that are "known good."

FIG. 3A illustrates a major chip 302 in a SCM and a flexible bridge 300. The major chip 302 is bonded to a substrate 306, such as a multi-layer ceramic substrate, with a set of tiny bonds 304. The substrate 306 is in turn bonded to the next-level wiring 310 (e.g. a PWB or PWC) by a set of large bonds 308 or connectors. Power and bi-directional signals are routed through the next-level wiring 310, the large bonds 308, the substrate 306, and the many tiny bonds 304 into the major chip. The flexible bridge 300 provides an additional channel for routing signals in and out of the SCM via either a conductive connection or PxC.

In FIG. 3A, cooling hardware 312 routes heat away from the top of the SCM. The cooling system is important to the function of the system, and typically care is taken to ensure the flexible bridge does not interfere with the cooling of the chip and other components. In one embodiment of the present invention, the flexible bridge can link to or otherwise take advantage of the cooling system. For instance, heat may be removed from the flexible bridge by transfer to a major chip 302, to the cooling hardware 312 (including but not limited to the module structure), and/or along the wires of the flexible bridge. Since a flexible bridge typically conducts heat more poorly than a rigid bridge that includes additional conductors, such as silicon, that help to spread the heat, an enhanced thermal conductivity layers and/or plane, for instance an additional metal layer, may be included on the flexible bridge specifically to transfer heat. A material such as an oil that transfers heat between the flexible bridge and the major chip 302 may also be used for heat transfer and cooling from/of either or both components. Note that a connector or alignment structure that applies force to create gentle contact between PxC regions may also assist in heat removal.

Figure 3B:
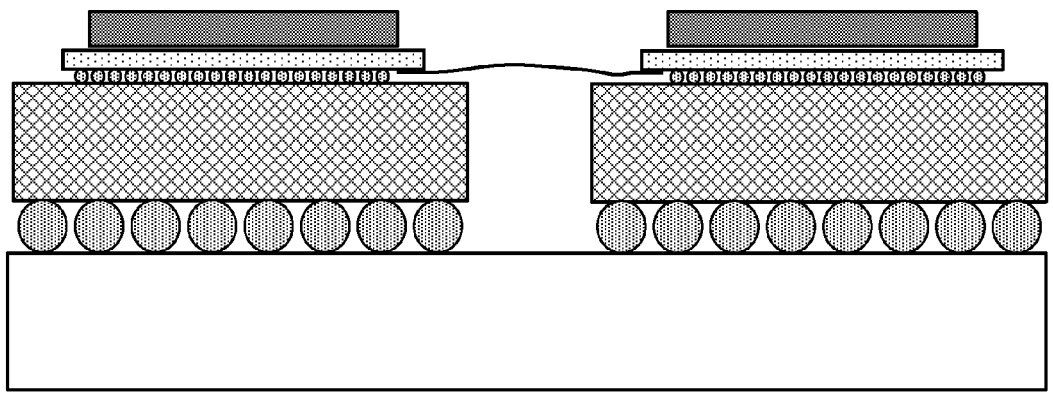
FIG. 3B illustrates two single-chip modules linked by a flexible bridge in accordance with an embodiment of the present invention.

FIG. 3B illustrates two chips mounted on separate SCMs that communicate using a short flexible bridge 300 that enables very high bandwidth. Because PxC connections can be de-mated and re-mated, each module in the pair can be reworked as needed. Despite these novel features and communication capabilities, these modules remain compatible with conventional PWC and PWB types.

The flexible bridge provides a high-bandwidth communication channel compatible with a conventional PWB or PWC, and includes many variations that support large bandwidth in a small geometry compatible with micro flexible printed wiring (μFPW) and PxC technologies. These structures enable considerable design freedom, and these can be tailored to many applications based on trade-offs including available chip area, PxC and wire density, technology risk, and bandwidth. One important characteristic of the flexible bridge is that the scale of the wires remains small, so that no intervening amplification structures are necessary and surfaces can communicate with low latency and high bandwidth. Because signal transmission is limited by the speed of light, distances between chips and hence the flexible bridges are typically short where possible. Sometimes using a flexible bridge relaxes space constraints, thereby allowing chips to be placed closer together and further increasing communication speed. Note that in the following descriptions that μFPW can be conductively connected to surfaces using a variety of techniques (described in more detail in later sections), for instance by bonding or by being directly fabricated upon the surface.

Figure 4A:
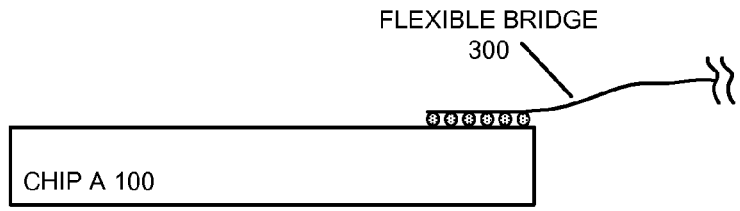
FIG. 4A illustrates a flexible bridge mounted to a chip in accordance with an embodiment of the present invention.
Figure 4B:
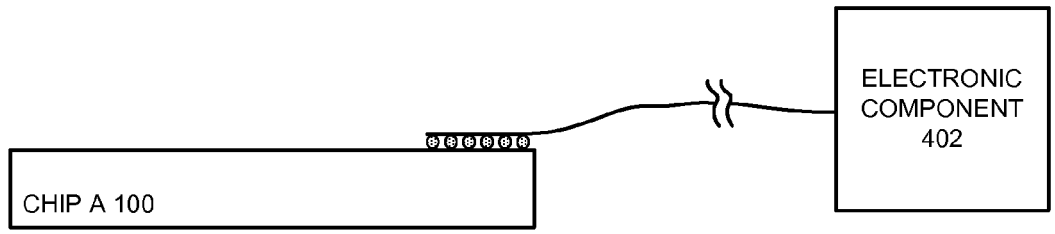
FIG. 4B illustrates a chip that communicates with another electronic component via a flexible bridge in accordance with an embodiment of the present invention.
Figure 4C:
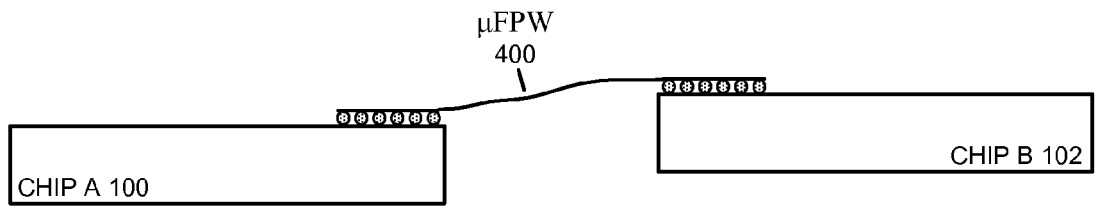
FIG. 4C illustrates a chip that communicates with another chip via a flexible bridge in accordance with an embodiment of the present invention.
Figure 4D:
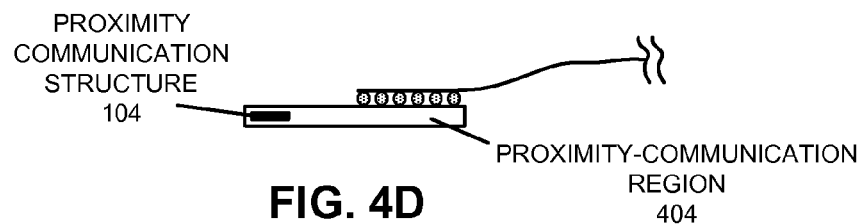
FIG. 4D illustrates a flexible bridge with proximity communication functionality in accordance with an embodiment of the present invention.
Figure 4E:
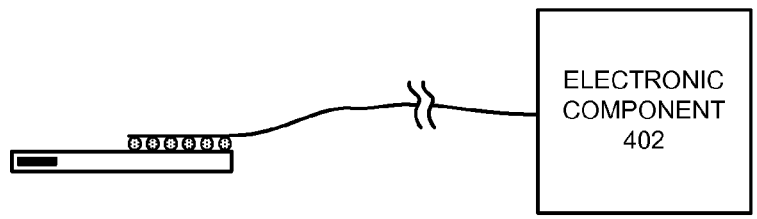
FIG. 4E illustrates a flexible bridge with proximity communication chip functionality connected to an electronic component in accordance with an embodiment of the present invention.
Figure 4F:
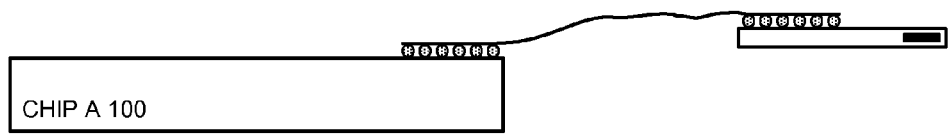
FIG. 4F illustrates a flexible bridge with proximity communication functionality connected to another chip in accordance with an embodiment of the present invention.
Figure 4G:
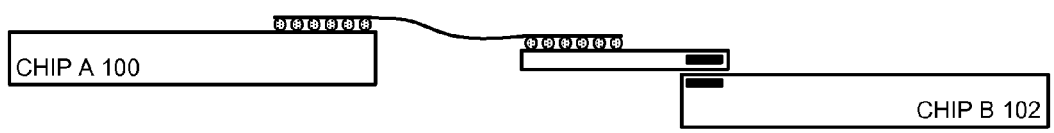
FIG. 4G illustrates a flexible bridge with a proximity-communication region that is used to enable proximity communication between two chips in accordance with an embodiment of the present invention.
Figure 4H:
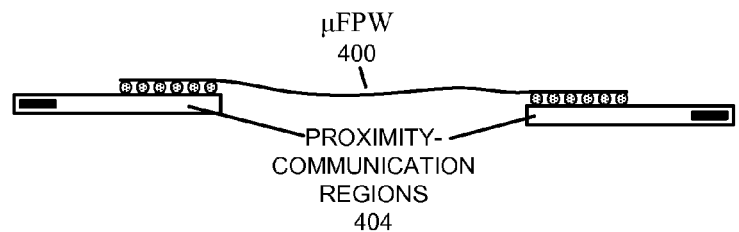
FIG. 4H illustrates a flexible bridge with two proximity-communication regions in accordance with an embodiment of the present invention.
Figure 4J:
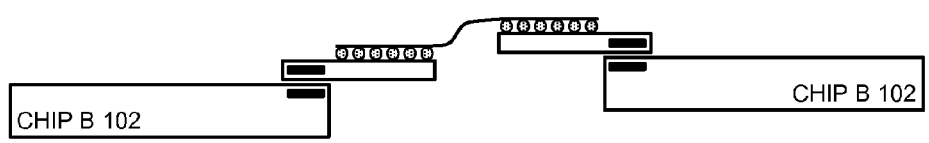
FIG. 4J illustrates a flexible bridge with two proximity communication regions that enables communication between two proximity-enabled chips in accordance with an embodiment of the present invention.
Figure 4K:
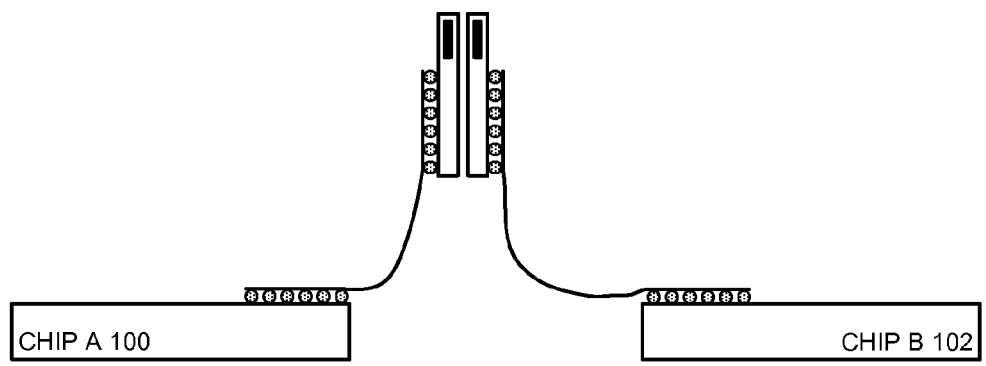
FIG. 4K illustrates two flexible bridges each comprised of an upwardly-facing piece of μFPW with proximity-communication regions that allow communication between them in accordance with an embodiment of the present invention.
Figure 4L:
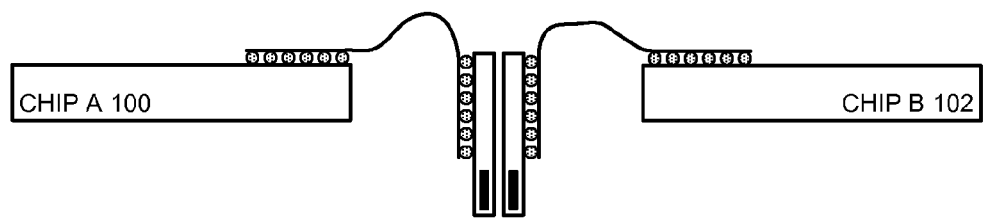
FIG. 4L illustrates two flexible bridges each comprised of a downward-facing piece of μFPW with proximity-communication regions that allow communication between them in accordance with an embodiment of the present invention.
Figure 4M:
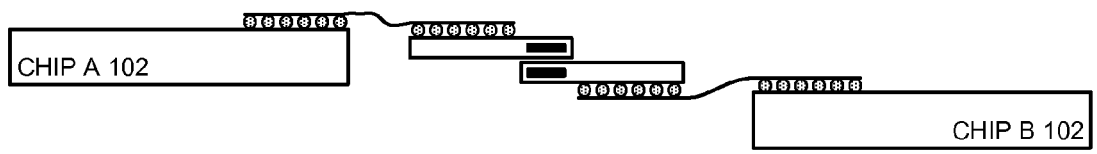
FIG. 4M illustrates two flexible bridges each comprised of a horizontally-oriented piece of μFPW with proximity-communication regions that allow communication between them in accordance with an embodiment of the present invention.
Figure 4N:
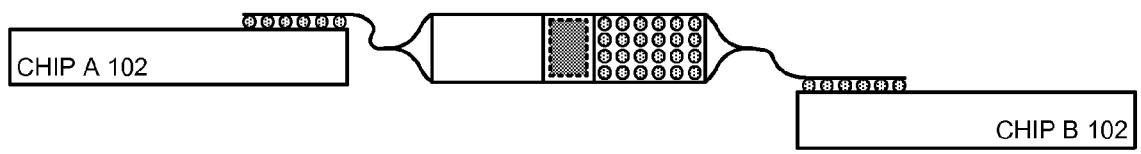
FIG. 4N illustrates two flexible bridges each comprised of a sideways-twisted, horizontally-oriented piece of μFPW with proximity-communication regions that allow communication between them in accordance with an embodiment of the present invention.

FIGS. 4A-4N illustrate different embodiments for inter-chip communication using a flexible bridge 300 that allows communication between electronic components using either conductive connections or PxC. Note that these embodiments can be combined and permuted to form many other embodiments.

FIG. 4A illustrates a flexible bridge 300 mounted to a chip, for instance using micro-bumps, as shown. Note that while the figure shows a bonded connection, this connection can also be "melded," e.g. fabricated at the wafer scale. The chip can communicate via the flexible bridge 300 with another electronic component 402 (as illustrated in FIG. 4B), including but not limited to another chip (as illustrated in FIG. 4C). FIG. 4C illustrates a flexible bridge comprised primarily of μFPW 400. Note that while this embodiment results in high bandwidth density, the flexible bridge in this case is not re-mateable, and that the conductive connections to the flexible bridge occur either during wafer processing or package assembly. As a result, the yield depends on the correct functionality of all of the units in the module, and is typically lower than for uncoupled components.

FIG. 4D illustrates a flexible bridge 300 that includes both μFPW 400 as well as a PxC region 404. Note that a flexible bridge 300 can include one or more PxC regions 404, as illustrated in later figures. Such PxC regions 404 can include, but are not limited to, bonding a piece of μFPW to a PxC chip and/or fabricating a μFPW that includes a set of proximity communication structures 104.

The embodiment in FIG. 4D can be used to add PxC to an electronic component 402 (as illustrated in FIG. 4E), including but not limited to another chip (as illustrated in FIG. 4F). FIG. 4G illustrates PxC between chip A 100 and chip B 102 using a flexible bridge 300 with a PxC region 404, in which the flexible bridge allows the module to be de-mated and re-mated at one end. The use of PxC for one part of the link allows the yield factors for the two modules to be uncoupled. Depending on the technique and technologies used, the PxC connection may result in a different bandwidth density than a conductive connection with a flexible bridge.

FIG. 4H illustrates a flexible bridge that comprises μFPW with two PxC regions 404. These two PxC regions 404 can be used to facilitate communication between two other PxC-enabled chips, as shown in FIG. 4J. The PxC regions 404 allow the flexible bridge 300 to be de-mated and re-mated at each end, and the PxC-enabled bridge can be added after the assembly and test of the SCMs, completely de-coupling the yield factors for the components. This embodiment is especially compatible with near-standard production of each module using conventional techniques.

The fourth embodiment uses two bridges that communicate with each other using PxC. At each outer end, the μFPW 400 is conductively connected to chip A 100 and chip B 102, respectively, as shown in FIGS. 4K-4N. This embodiment allows de-mating and re-mating of the communication link between the roughly coplanar major chips, and uncouples the yield factors for the two modules. The PxC regions 404 may provide signal regeneration, thereby enabling a flexible bridge with longer aggregate length to provide very large bandwidth. FIG. 4K illustrates the PxC regions 404 facing upward, while FIG. 4L illustrates the PxC regions 404 facing downward. FIG. 4M illustrates the PxC regions 404 oriented horizontally, while FIG. 4N illustrates the PxC regions 404 oriented horizontally but with a twist in the μFPW that tilts the PxC chips sideways. The μFPW may include additional slack or wiggles, or have a customized shape, to enable this twist and to facilitate assembly and accurate alignment in the face of various perturbations and tolerances. Some configurations may also use mechanical alignment guides, clamps, and supports to mate together the PxC regions 404 and/or major chips. Once fabricated, the finally assembly is typically quite tolerant with in six degrees of freedom, with little vulnerability to perturbation. Note that while the PxC regions 404 are drawn rather large for clarity, the PxC regions 404 may generally be larger or smaller.

Application goals typically determine which embodiment is most suitable. An advantage of the embodiment shown in FIG. 4J is that a PxC-enabled bridge attached later may reduce additional complexity derived from having a bridge attached to a chip during the assembly of a module. Note, however, that while using a flexible bridge with PxC functionality can potentially reduce or eliminate the alignment requirements at the chip and/or module level, the PxC regions on the μFPW and on PxC-enabled chips still need to be precisely aligned to enable communication. This alignment may involve, for instance, an alignment guide with mating positive and negative features, or other alignment structures.

Micro Flexible Printed Wiring

Figure 5:
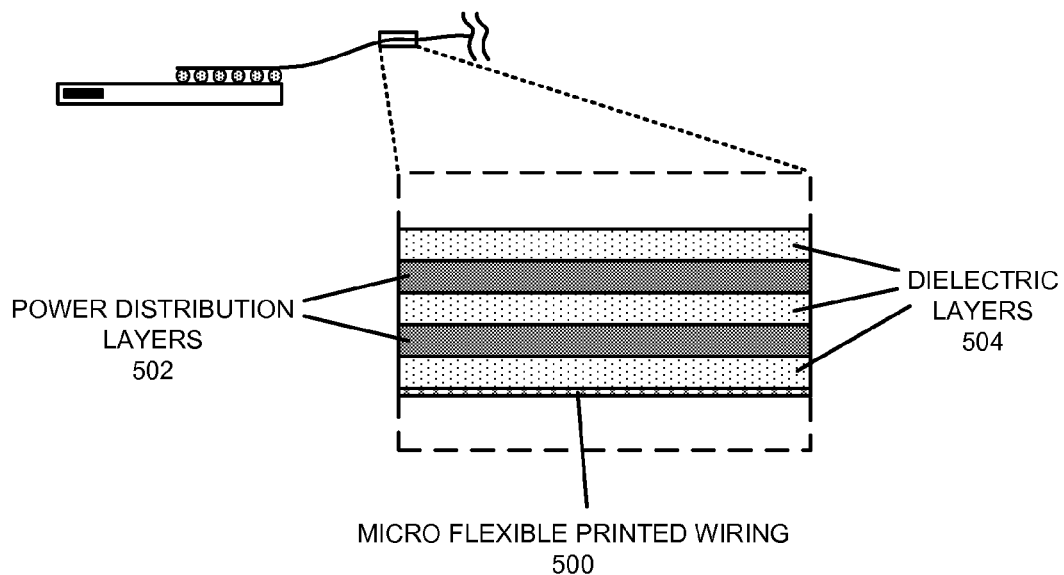
FIG. 5 illustrates a flexible bridge comprised of a μFPW layer for data signals as well as a set of larger-scale power distribution layers separated by dielectric layers in accordance with an embodiment of the present invention.

Important criteria for a flexible bridge include flexibility and wire pitch. A flexible bridge typically includes wires for many wide-band signal channels. In one embodiment of the present invention, the channel pitch of the μFPW can be between 3 and 50 micrometers. Because the flexible bridge is not protected by a rigid structure, the structure may also be augmented by larger-scale flexible printed wiring that provides mechanical reinforcement, protection, power distribution, and out-of-band signaling. FIG. 5 illustrates a flexible bridge comprised of a μFPW 500 layer for data signals as well as a set of larger-scale power distribution layers 502 separated by dielectric layers 504. Note that the thin signal lines (μFPW 500) typically use a fine-featured process substantially similar to the process used for features on ICs, while the larger-scale layers may comprise a more conventional cable or process. For instance, the μFPW may be laminated upon a thicker and coarser FPW.

Flexible bridges can be constructed and melded (or connected) to surfaces using a variety of subtractive and additive μFPW techniques including, but not limited to:

IC back-end-of-the-line (BEOL): BEOL is a process suited for chips with many layers of fine wiring fabricated atop a wafer with electronic devices. Typically such wiring layers are fabricated by deposition and/or plating of metal and dielectric upon a wafer with semi-conductor electronic devices, thereby allowing many layers and a wide range of wire pitch. One variation uses extremely coarse BEOL wiring that approximate microstrip transmission lines, thereby pushing signaling into a much faster LC mode at the cost of extra wiring resources and additional power.

Thin-film wiring (TFW): Some chip substrates (e.g. an organic substrate for a SCM) include several layers of TFW with fine pitch and high density of wires. Such TFW layers typically are fabricated using additive processes, such as additive plating or vapor deposition through a resist mask layer, and typically are fabricated sequentially upon other, coarser layers in a manner substantially similar to the fabrication of a small PWC.

System-in-a-package (SIP) or System-on-a-package (SOP): SIP and SOP start with multiple independent IC chips, and then add BEOL-like wiring to link the chips inside a package or module, typically resulting in wiring pitch and technology substantially similar to the less-dense layers of BEOL wiring.

Bumpless build-up layer (BBUL): BBUL technology deposits patterned layers of dielectric and metal upon a set of chips that have been accurately aligned in the x-, y-, and z-directions.

Fabricate and join (F&J): F&J first fabricates wiring layers upon a flat plate, and then bonds chips to the layers. After bonding, the resulting assembly is released from the flat plate.

Subtractive printed wiring (SPW): SPW represents the fine extreme of classical printed wiring technology, and typically uses substrative patterning of copper layers to make wire layers with fine pitch. These layers are joined with ICs using various bonding processes such as thermo-compression of metal, solder balls, or wiring bonding.

Such technologies allow μFPWs to be fabricated in multiple ways, with the actual design choice depending on the desired design criteria for the flexible bridge.

Figure 6A:
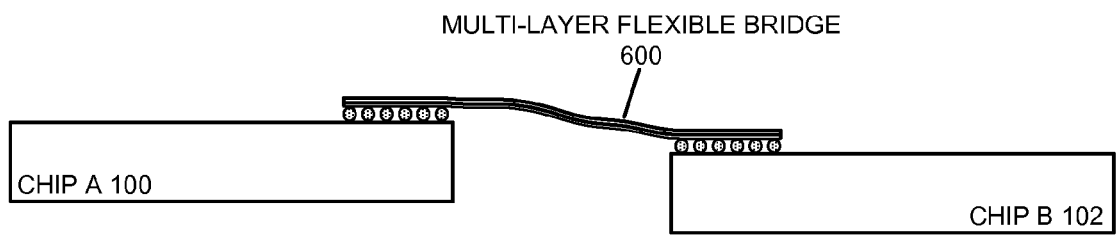
FIG. 6A illustrates a flexible multi-layer bridge between two chips in accordance with an embodiment of the present invention.
Figure 6B:
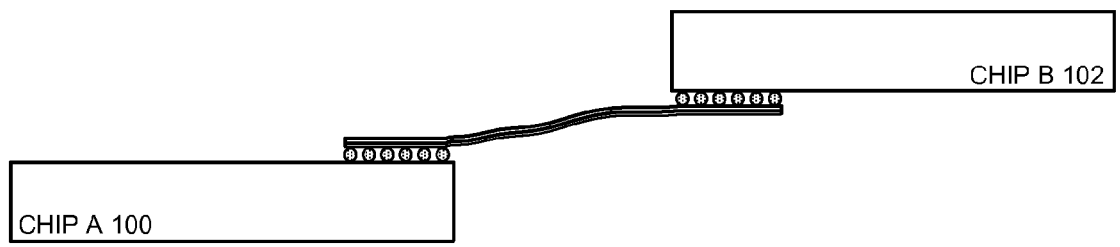
FIG. 6B illustrates a flexible multi-layer crossed bridge between two chips in accordance with an embodiment of the present invention.

FIG. 6A and FIG. 6B illustrate two chips and a multi-layer flexible bridge 600. FIG. 6A illustrates a "direct bridge" substantially similar to the thin flexible bridge in FIG. 4C, but with additional layers. FIG. 6B illustrates a "crossed bridge," where the two components are melded with opposite faces of the μFPW. In this embodiment, the μFPW may provide connections such as vias that connect between the two sides of the flexible bridge.

Figure 7A:
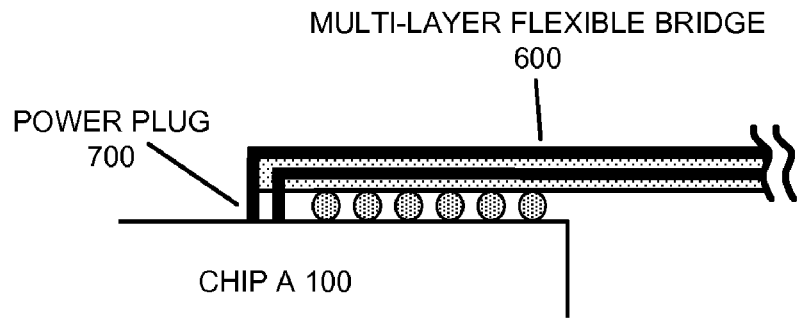
FIG. 7A illustrates a multi-layer flexible bridge with power paths soldered to a chip in accordance with an embodiment of the present invention.
Figure 7B:
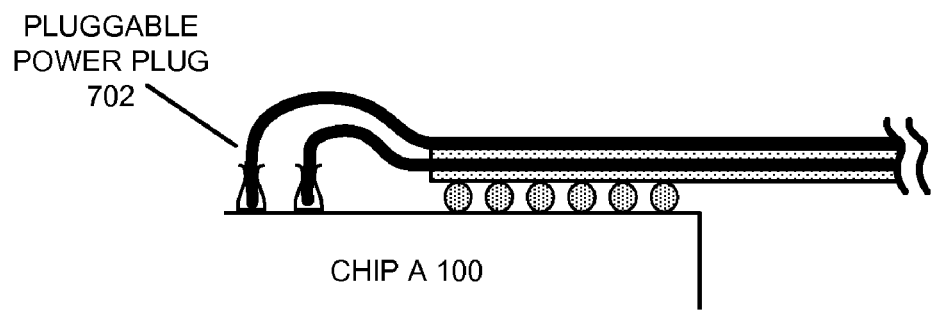
FIG. 7B illustrates a multi-layer flexible bridge with power paths that terminate in a pluggable power plug in accordance with an embodiment of the present invention.
Figure 7C:
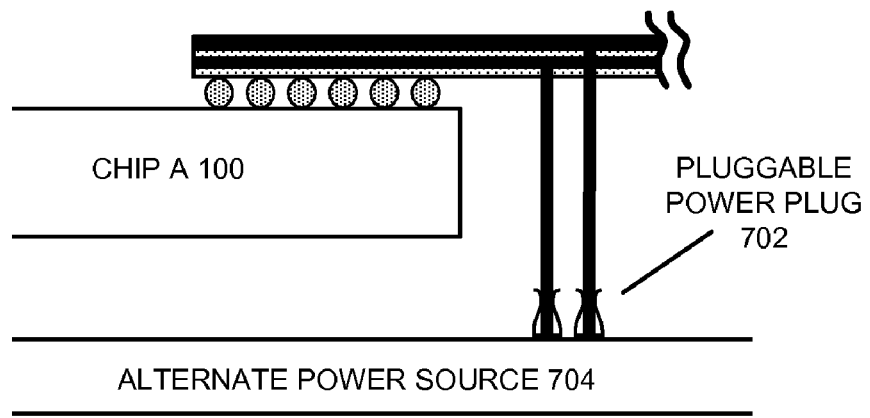
FIG. 7C illustrates a multi-layer flexible bridge with a power path that includes more than two ends in accordance with an embodiment of the present invention.

FIGS. 7A-7C illustrate a multi-layer flexible bridge 600 in which the power paths extend to locations where power can be fed into the bridge. Such power paths typically have low DC resistance and low AC inductance. In one embodiment of the present invention, illustrated in FIG. 7A, these power paths are soldered to a chip close to the area where the thin data layer is also attached. In another embodiment, illustrated in FIG. 7B, the power paths extend beyond the end of the μFPW, perhaps to a location that includes less dense signal wiring and electronics and is therefore more suitable for providing power. The power path can also include a pluggable power plug 702 that allows the power connection to be de-mated and re-mated.

Figure 8A:
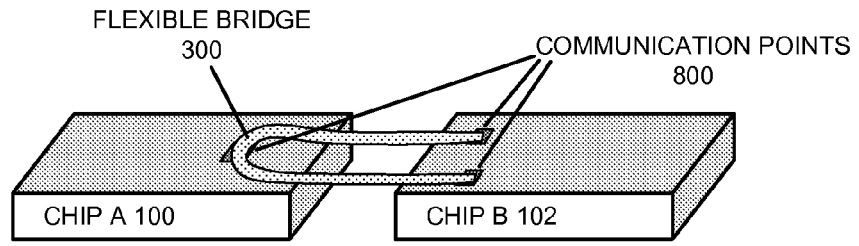
FIG. 8A illustrates a flexible bridge that runs from a chip to another chip and then back to the original chip in accordance with an embodiment of the present invention.
Figure 8B:
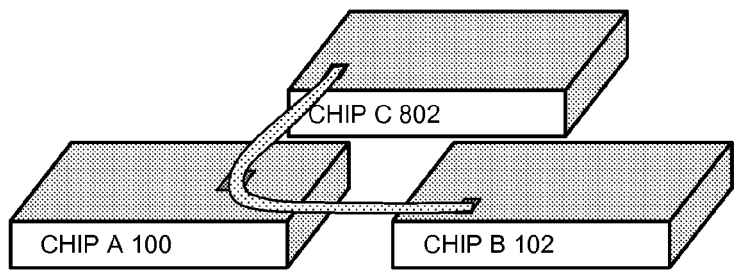
FIG. 8B illustrates a flexible bridge that enables communication between three chips in accordance with an embodiment of the present invention.

Note that a flexible bridge can include more than two ends and connect more than two modules. The additional modules can be conductively connected to the flexible bridge, or communicate with the bridge using PxC circuits. FIG. 7C illustrates a T-shaped μFPW in which the μFPW extends to an alternate power source 704 independent of the two components connected to the communication layer of the flexible bridge. FIG. 8A illustrates a flexible bridge that runs from chip A 100 to chip B 102 and then back to chip A 100. This configuration has three communication points 800, which allows a "dead-reckoned" handshaking by each module; data sent from chip A 100 traverses the μFPW to chip B 102, and then returns back to chip A 100. When chip A 100 receives the return signal, the chip knows that chip B 102 has received the signal and that the next signal can be sent. Such flow-control is substantially similar to chip B 102 acknowledging the packet, but involves less latency. FIG. 8B illustrates a flexible bridge that enables communication between chip A 100, chip B 102, and chip C 802.

Power layers can also include, link to, and/or power additional devices in proximity to the flexible bridge, such as circuitry to repeat signals over long wiring regions or decoupling power capacitors that counteract the effect of inductance upstream in the power distribution sub-system. Because signals typically attenuate super-linearly with wire length, adding circuit regions to repeat signals can decrease latency as well as increase bandwidth per cross-section. Such structures may use older silicon technologies, because such technologies typically include thicker wiring layers that may improve wire performance.

Figure 9A:
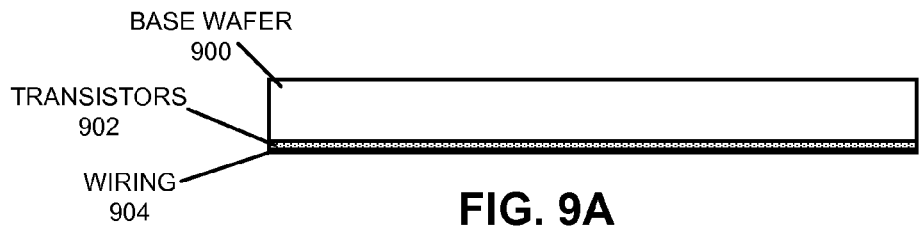
FIG. 9A illustrates a base wafer with transistors and a wiring layer that will be selectively thinned using a subtractive process in accordance with an embodiment of the present invention.
Figure 9B:
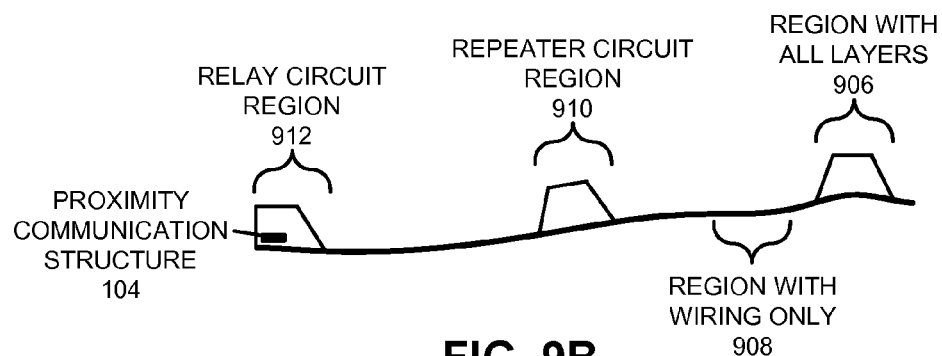
FIG. 9B illustrates a base wafer that has been selectively thinned using a subtractive process in accordance with an embodiment of the present invention.

In one embodiment of the present invention, a subtractive process is used to create a flexible bridge that includes regions with active circuitry. FIG. 9A illustrates a base wafer 900 with transistors 902 and a wiring layer 904 that will be selectively thinned using a subtractive process that disintegrates or dissolves part of the wafer but leaves some circuits and silicon. FIG. 9B illustrates the outcome of a selective thinning process, which has left some regions with all layers intact 906 and some regions with wiring only 908. The regions with layers intact 906 can include repeater circuit regions 910 as well as relay circuit regions 912. For instance, BEOL wires on a μFPW can be shaped into a proximity communication structure 104 that communicates with a nearby chip. Such communication can be inductive or capacitive, and obviates the need to conductively connect an additional PxC chip to the end of the flexible bridge.

Alternatively, thin-film transistors (TFTs) may be used to actively relay or latch data signals across μFPW. While TFTs have poor characteristics when compared to bulk silicon devices, in some cases they may be adequate to significantly extend the range and bandwidth of the flexible bridge.

Flexible Bridge Bandwidth

The bandwidth available on a flexible bridge depends highly on whether the μFPW includes active circuitry (either silicon transistors or TFTs). A shorter bridge does not need as wide a set of wires as a longer bridge, which increases the number of wires available and hence the total bandwidth for shorter bridges.

For a non-active bridge, the μFPW typically needs to carry signals with limited rise-time in order to meet standard digital reliability and noise constraints. Long rise-times can lead to noisy inter-symbol interference and hot electron degradation on receivers. Typical designs seek a RC time constant that does not exceed eight gate delays. This time constant scales with the square of the bridge length, and factors in determining the minimum wire size. For instance, in order to span a length of 5-8 mm using wires available in a 130 nm process, the wires should be at least roughly 2 μm wide and be separated transversely by at least roughly 2 μm. Extending the bridge by 10% would need a wire with 20% less RC product, which can create difficulty, because a wider wire has less resistance but more capacitance. As a result, a longer μFPW might be achieved using an even older technology with thicker wires.

Because long wires are susceptible to outside noise events, signals may also be sent differentially, with each channel including one wire devoted to the data bit and another wire sending the logical inverse of the data bit. This technique improves noise immunity significantly, at the cost of an extra wire for each data channel. In flexible bridges with multiple layers, grounds planes can be placed above and/or below the signal wires to further address noise concerns. Additional layers of metal can also be used to bit-twist data lines and decrease differential-mode and/or common-mode coupling between data bits. For the previous example, each channel might as a result grow to a size of 8 μm. Timing signals and other out-of-band controls that ride alongside the data can also add an overhead of 10-50%, leading to a conservative 12 μm per channel total in this example.

Flexible bridge designers can use factors such as bridge length and wire channel size during the design process to estimate bandwidth density. For instance, to continue the example mentioned above, the channel bandwidth can be computed by allowing each data signal to rise and hold. Conservatively allowing each data item to hold for three times the rise-time results in each bit taking 32 gate delays, and lead to 1.6 Gbps per channel, or 16.7 GBps/mm in a 90 nm technology.

Estimated bandwidth can also be calculated for a μFPW bridge that includes active devices. When spaced appropriately, active devices can serve as latching repeaters and allow a new bit can be transmitted each clock cycle (where a clock cycle is typically 15-25 gate delays) independent of the bridge length.

Modules using Flexible Bridges

As mentioned previously, FIG. 3A illustrates a major chip 302 in a SCM that can communicate through a flexible bridge. As mentioned previously, the flexible bridge can be melded with the major chip 302, or can communicate with the major chip 302 using PxC. In the latter case, the perimeter of the major chip includes an array of PxC connectors, including terminals and electronic devices. This and the following configurations also typically include a way to precisely and accurately align the PxC pads on the bridge with the corresponding PxC pads on the major chip. Both conductive and PxC connections allow many channels and a large bandwidth of signals to enter and leave a small area of the major chip 302.

Figure 10:
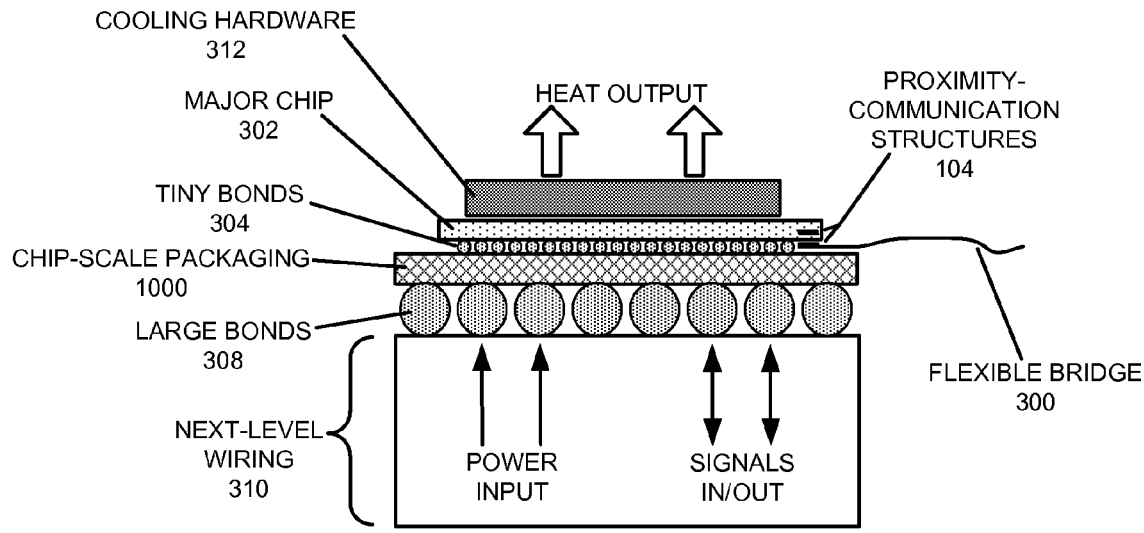
FIG. 10 illustrates a module variation in which a major chip is bonded to chip-scale packaging in accordance with an embodiment of the present invention.

FIG. 10 illustrates a module variation in which a major chip is bonded to chip-scale packaging 1000 instead of a substrate.

Figure 11:
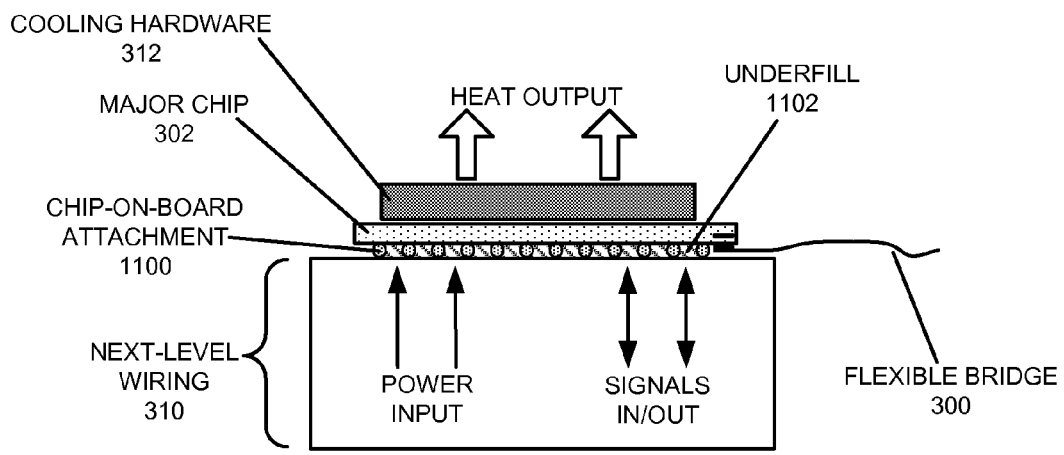
FIG. 11 illustrates a module variation in which a major chip is attached to next-level wiring by a chip-on-board attachment in accordance with an embodiment of the present invention.

FIG. 11 illustrates a module variation in which a major chip is bonded to the next-level wiring 310 using chip-on-board attachment 1100. This variation may also include underfill 1102, which is typically a plastic filler that provides mechanical reinforcement of tiny bonds between a major chip 302 and the item the chip is bonded to by encapsulating the bonds and providing partial chemical encapsulation. Underfill 1202 is typically injected as a low-viscosity un-polymerized liquid that is then heated and polymerized into a solid.

Underfull adds strength and durability to the bonds, but can interfere with the alignment of the flexible bridge. One embodiment of the present invention adjusts the underfill to accommodate the flexible bridge.

Underfill liquids typically spread through capillary action, and are therefore sensitive to surface energy. Various coatings or surface preparation techniques can be used to modify surface energy and thereby steer capillary action. Providing high surface energy to the area in which the major chip 302 and flexible bridge 300 mate prevents underfill from filling in the terminal array used for communication. Additional embodiments use a tiny "dam" to block the flow of underfill to the terminal array, or avoid using underfill completely at the cost of reduced durability and leaving the tiny bonds more vulnerable to mechanical stress. An alternate embodiment mates the flexible bridge with the terminal array on the major chip 302 and then injects underfill, thereby enabling PxC communication but giving up re-mateability between the chip and bridge. This approach may be appropriate and/or valuable, for instance in some applications in which test, burn-in, and rework can be completed adequately before injecting underfill. Depending on the embodiment of the flexible bridge, re-mateability may also be provided elsewhere along the bridge.

Figure 12:
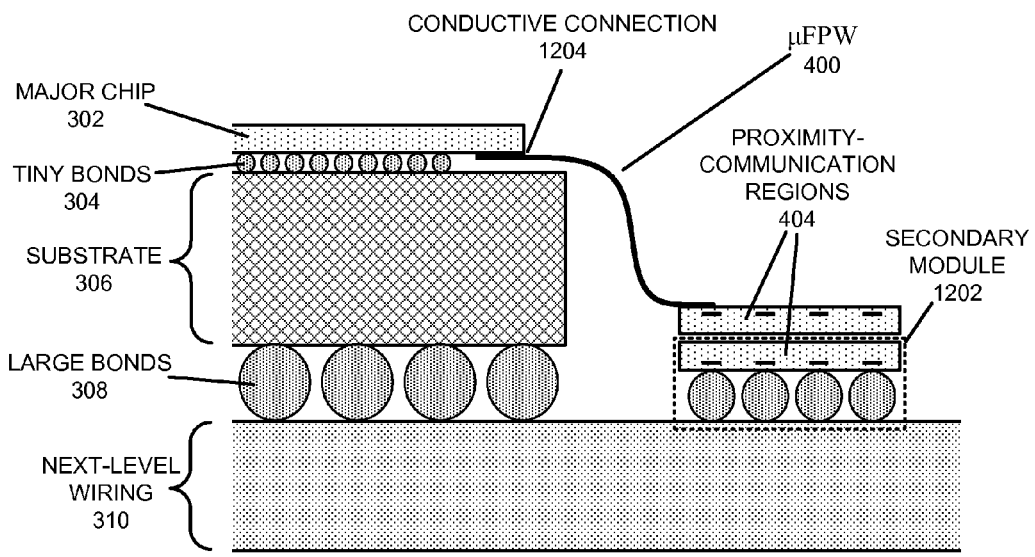
FIG. 12 illustrates an augmented socket for a module with a flexible bridge that includes proximity communication in accordance with an embodiment of the present invention.

FIG. 12 illustrates an augmented socket for a module with a flexible bridge comprised of µFPW 400 and a PxC region. A major chip 302 is mounted to a SCM substantially similar to the one illustrated in FIG. 3A. An array of terminals along the perimeter of the major chip 302 are linked through a flexible bridge to the PxC region 404, which connects re-mateably to a PxC region 404 in a secondary module 1202. The use of the secondary module 1202 adds considerable bandwidth and connectivity from the major chip 302 to the next-level wiring 310 compared to conventional SCMs, thereby transcending the wireability limits of convention SCMs, ball-grid arrays, land-grid arrays, and PWC. Also, because the additional connectivity and bandwidth are offset from the major module they bypass wiring congestion in the PWC, thereby avoiding related problems in fabrication and yield for the PWC.

While the flexible bridge in FIG. 12 is conductively connected 1204 to the major chip 302 and the two PxC regions 404 communicate using penetrating PxC signaling, this configuration can use any of the preceding embodiments for flexible bridges. In further embodiments, the PxC region 404 of the secondary module 1202 may comprise a PxC chip bonded to the next-level wiring 310 and reinforced with underfill, or the secondary module 1202 may include a small substrate. Some PxC chips with relatively small area may facilitate direct bonding to the PWC, thereby reducing the fabrication cost of the PxC chips. Note also that because the PxC chips are small and typically include few devices, they might use a simpler IC fabrication process that results in high yield and low cost.

The secondary module 1202 can be considered an augmented socket for the SCM. If the SCM is connected to the PWC, rather than bonded, the SCM (including the major chip 302), along with the connected bridge and PxC region 404, can be readily de-mated and replaced. This capability is particularly useful if the yield is not perfect, for instance in the case of "infant mortality defects" that slip past burn-in and test of the SCM.

Figure 13:
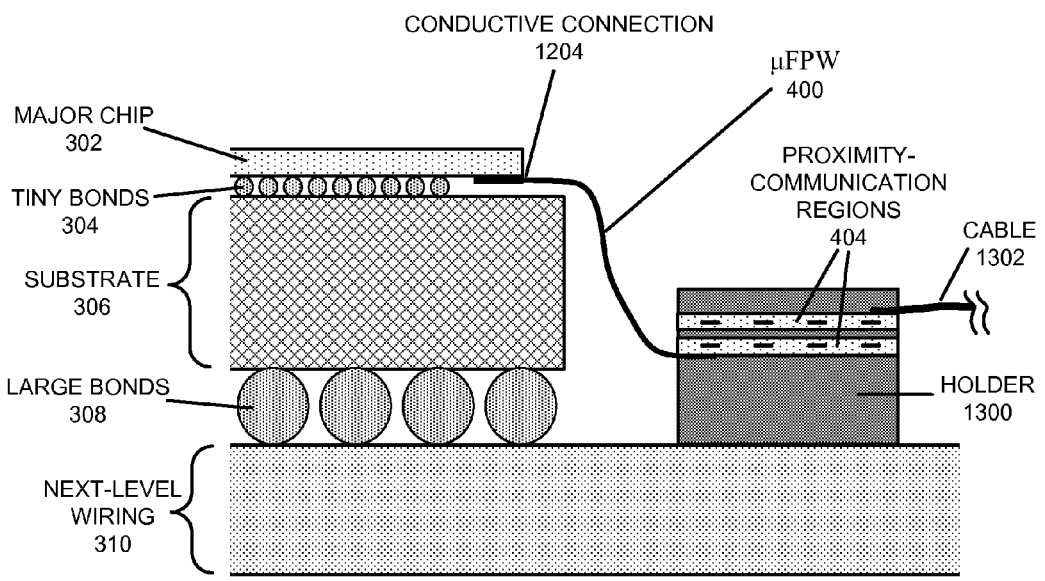
FIG. 13 illustrates a flexible bridge that re-mateably connects to a proximity communication region of a second flexible bridge held by a holder on the printed-wiring card in accordance with an embodiment of the present invention.

FIG. 13 illustrates a flexible bridge that re-mateably connects in a holder 1300 on the PWC to a PxC region 404 connected to a cable 1302. The holder 1300 serves to accurately align the PxC regions 404 and anchor the cable 1302, thereby mechanically isolating the flexible bridge from stresses and strains in the cable 1302. The holder can also serve as a cooling bracket or air fin that transfers heat away from the PxC regions 404. Note that one or both PxC regions 404 can provide additional functions related to communication along cable, for instance by functioning as a transmitter, a receiver, an amplifier, a filter, timing logic, and/or protocol logic. This embodiment enables a major chip 302 and cable 1302 to be connected re-mateably with very large bandwidth and large wireability.

Figure 14:
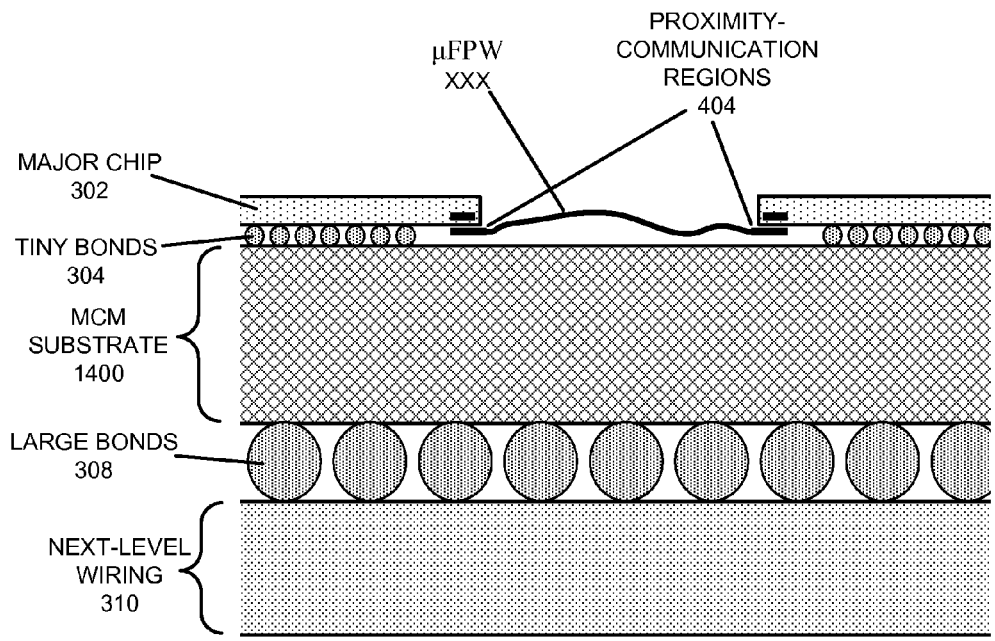
FIG. 14 illustrates a multi-chip module with an internal flexible bridge that uses proximity communication in accordance with an embodiment of the present invention.

FIG. 14 illustrates a MCM with an internal flexible bridge 300 that uses PxC. In this embodiment, two major chips 302 are each bonded to one MCM substrate 1400. In many such applications the active faces of the two major chips 302 are accurately co-planar, but this alignment is less important because the flexible bridge mostly eliminates the need for precise alignment. The flexible bridge can be useful in cases where the MCM does not enable adequate bandwidth or wireability between the two chips.

Figure 15:
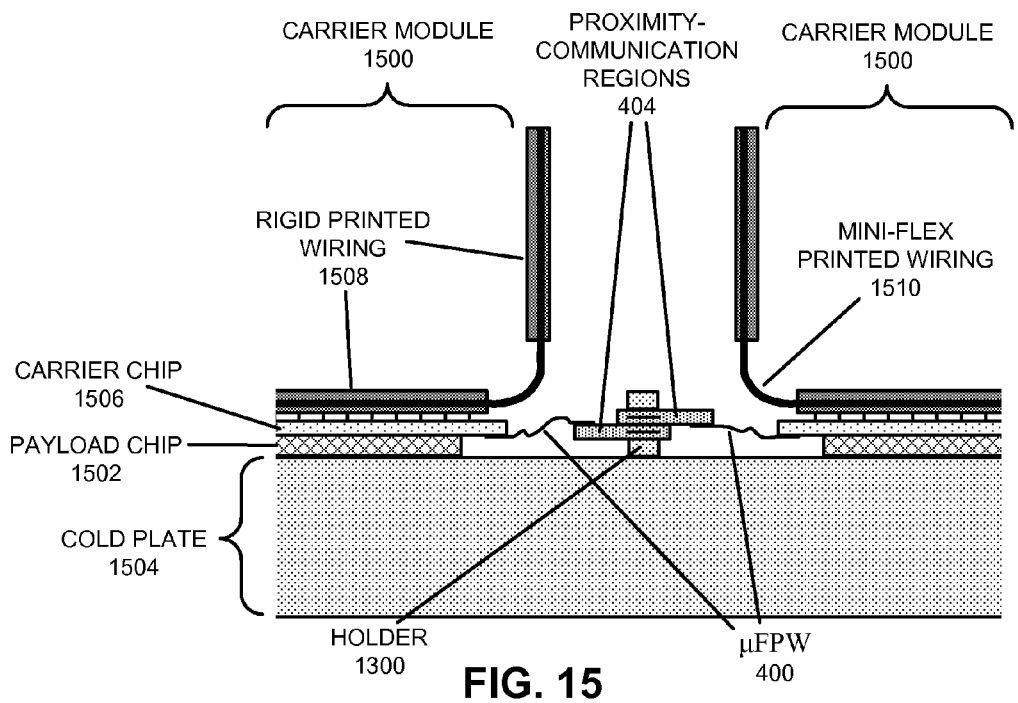
FIG. 15 illustrates a multi-chip module with two carrier modules in which the payload chips are placed on top of a shared cold plate in accordance with an embodiment of the present invention.
Figure 16:
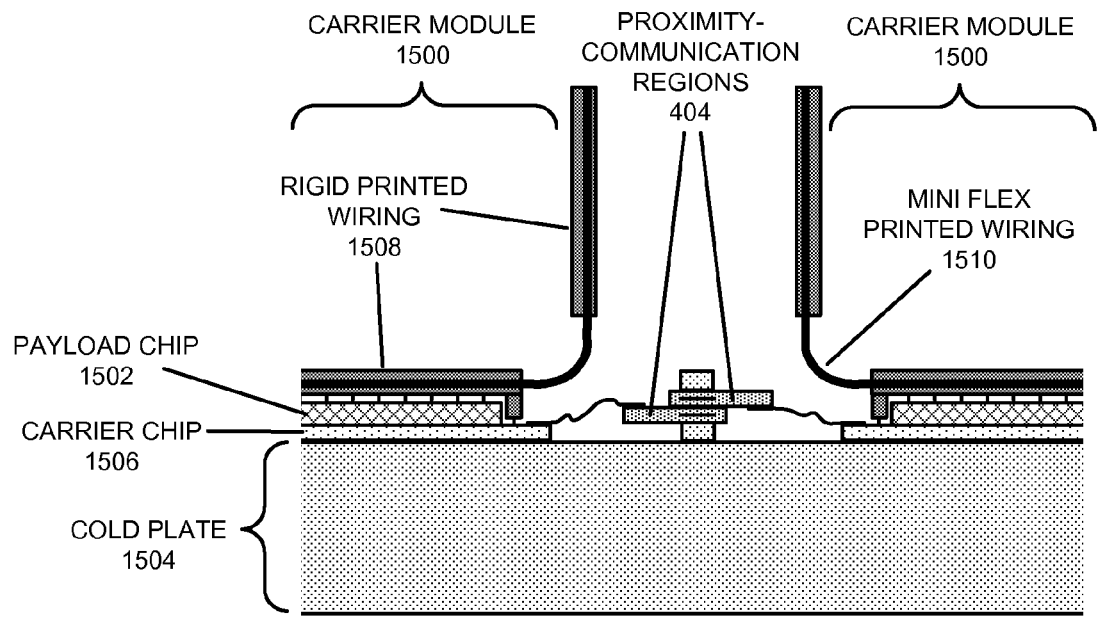
FIG. 16 illustrates a multi-chip module with two carrier modules in which the carrier chips are placed on top of a shared cold plate in accordance with an embodiment of the present invention.
Figure 17:
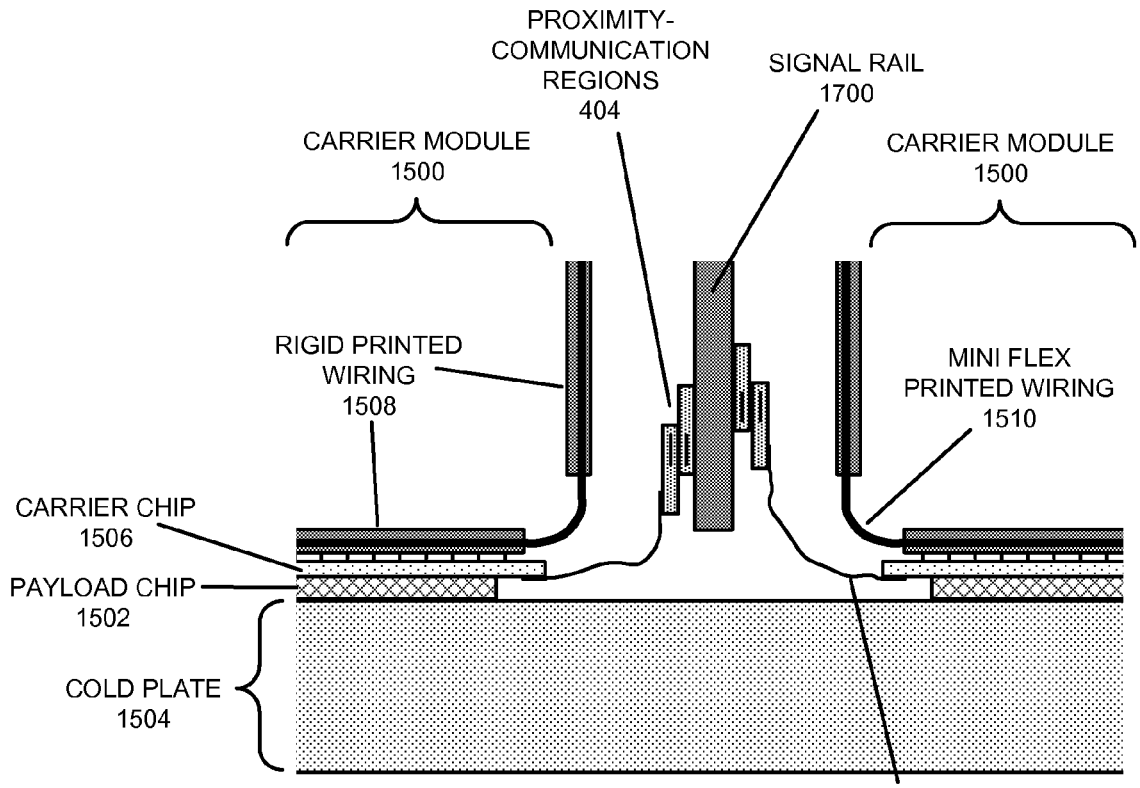
FIG. 17 illustrates a multi-chip module that includes a signal rail in accordance with an embodiment of the present invention.

FIGS. 15-17 illustrate a flexible bridge in an environment with a vertically reversed structure. FIG. 15 illustrates a MCM with two carrier modules 1500 in which the payload chips 1502 are placed on top of a shared cold plate 1504. In one embodiment of the present invention, payload chips comprise chips with a compute function, while carrier chips receive and process signals from payload chips and then use PxC pads transfer them to another device. Payload chips and carrier chips typically are combined together into a chip stack.

In FIG. 15, the payload chips 1502 are mounted to carrier chips 1506 which receive power from a power distribution structure comprised of rigid printed wiring 1508 and mini-flex printed wiring 1510. A flexible bridge that includes two proximity-communication regions 404 in a holder 1300 provides a re-mateable communication link between the two carrier chips 1506. A semi-automated tool can work with the holder and PxC chips for insertion, alignment, and removal.

FIG. 16 illustrates an MCM substantially similar to the MCM in FIG. 15, but with the carrier chips 1506 placed on top of the shared cold plate 1504 and the payload chips 1502 connected to the power distribution structure. Note that in some embodiments of the present invention the holder 1300 may also be used to transfer heat from the flexible bridge, for instance to the cold plate 1504.

FIG. 17 illustrates an MCM substantially similar to the MCM in FIG. 15 with the addition of a PCB of cable, called a "signal rail" 1700, that is perpendicular to the two carrier modules 1500. This signal rail 1700 can be used for longer-range connectivity among a two-dimensional array of modules, with each module linking to the signal rail through a flexible bridge.

Figure 18:
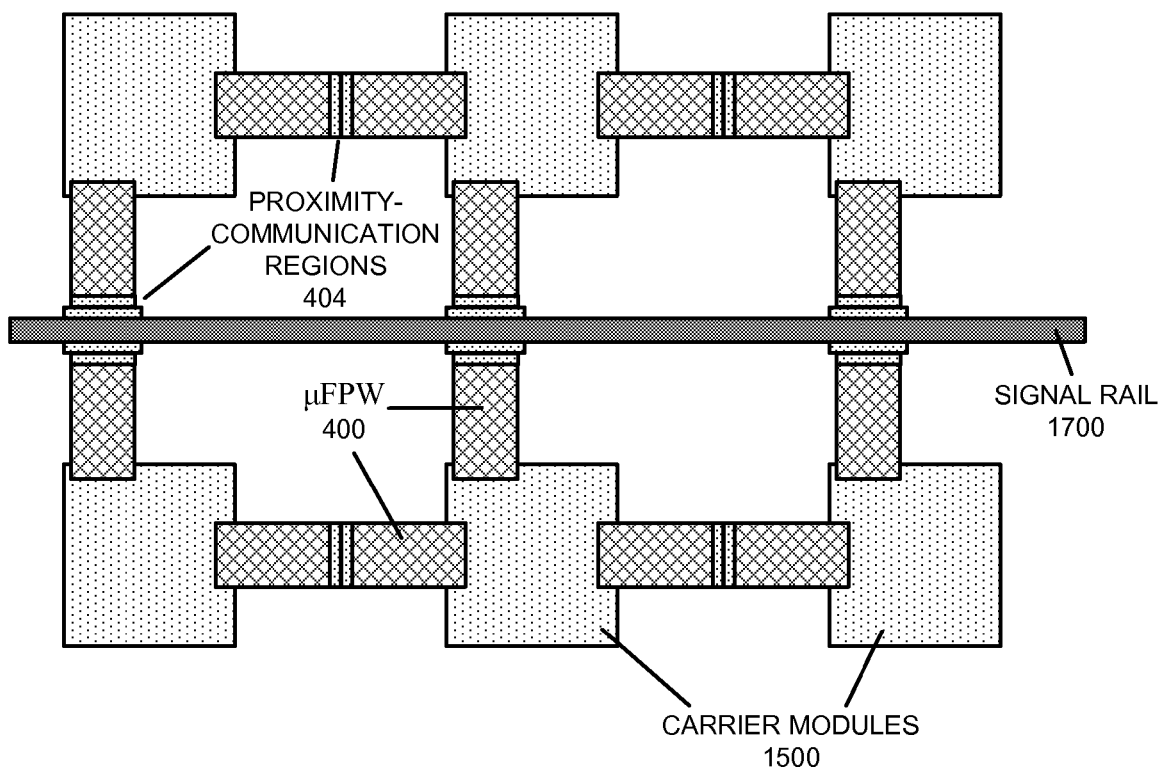
FIG. 18 illustrates a signal rail that enables communication for a number of carrier modules in accordance with an embodiment of the present invention.
Figure 19:
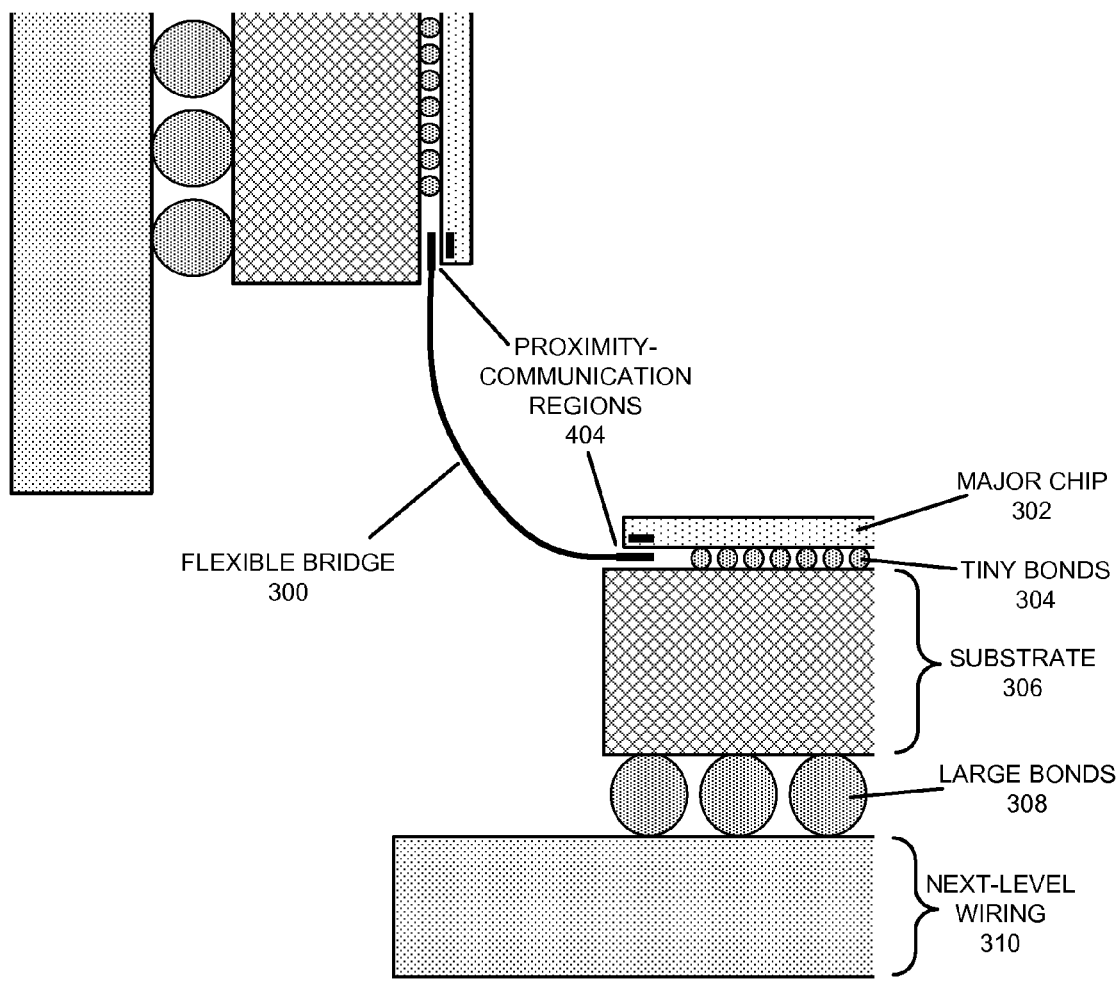
FIG. 19 illustrates perpendicular modules connected by a flexible bridge in accordance with an embodiment of the present invention.
Figure 20:
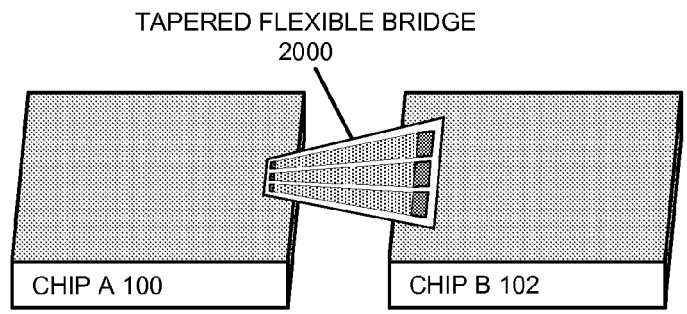
FIG. 20 illustrates a tapered flexible bridge in accordance with an embodiment of the present invention.

FIG. 18 illustrates a signal rail 1700 that enables communication for an array of carrier modules 1500. Communication through the signal rail 1700 may enable faster latency compared to multiple successive PxC hops between many adjacent pairs of carrier modules. Note that this drawing shows connectivity for signals in one plane, and that additional flexible bridges may provide connectivity in the vertical or other directions as well. FIG. 19 illustrates perpendicular modules connected by a flexible bridge, and illustrates how a flexible bridge can link modules in very different planes.

At the logical level, flexible bridges connecting modules and chips allow differences between the chips and functions at the two ends of the bridge. These structures can provide significant benefits if concentrating functionality on one module or one chip exceeds constraint or incurs excessive cost due to area, power, cooling, complexity, fabrication, yield, or other issues and resources. Additionally, overlapping functions can be spread out across multiple components to, for instance, improve reliability or facilitate chip specialization and process optimization. Depending on the functionality, one module may use a smaller area, less power, and/or a simpler structure than another module at the other end of the flexible bridge.

For some applications area on one chip is more precious than area on the other chip. FIG. 19 illustrates a tapered flexible bridge 1900 that is asymmetric with respect to the chip area used on each respective end. The mating arrays comprise denser pitch and a small area on chip A 100 and looser pitch and a larger area on chip B 102. Note that if the wires in the μFPW bridge taper as well they then present improved RC characteristics to drivers on the wide end of the taper. Drivers driving the wide end of an "ideally tapered" wire see an RC delay that is linear with length, instead of quadratic with length. While ideal tapering involves exponential tapering, which is usually impractical, even without ideal tapering drivers driving the wider ends typically still see a significant delay improvement. Such a configuration can be used, for instance, to connect memory devices to a CPU. Because the vast majority of CPU requests to the memories are typically reads, the tapers could be arranged to optimize signal transfer in that direction. This arrangement results in lower latency and higher bandwidth, thereby improving overall performance.

Figure 21:
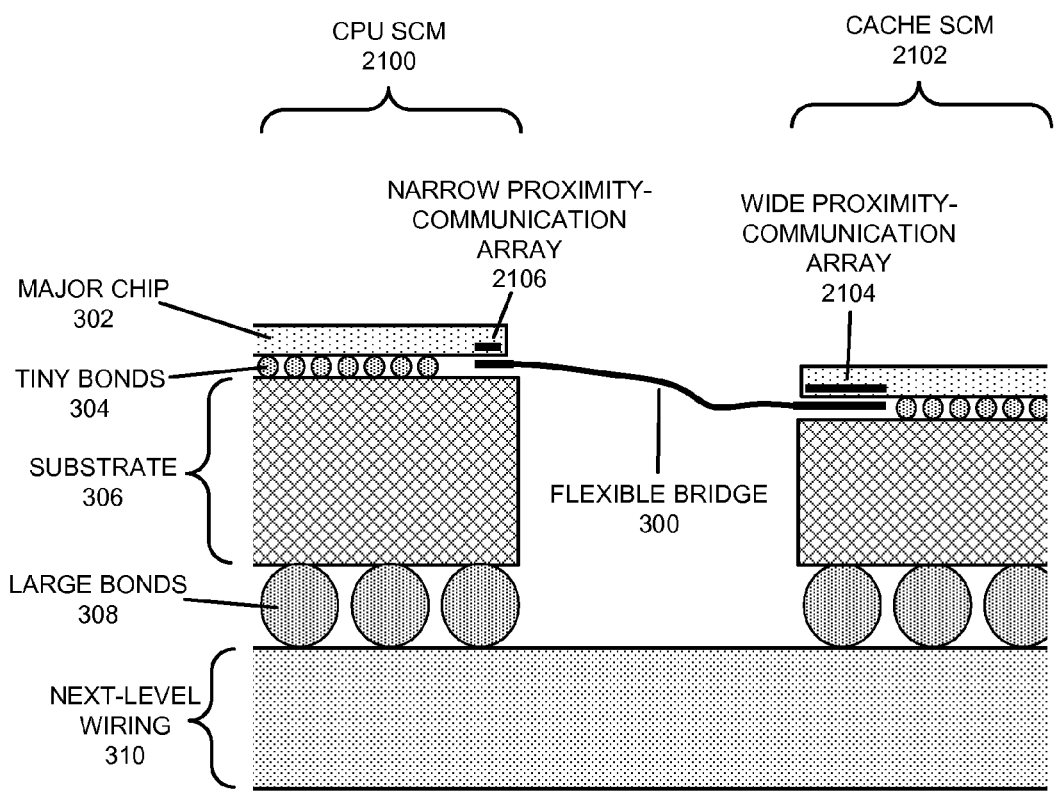
FIG. 21 illustrates a CPU and cache that communicate using a flexible bridge in accordance with an embodiment of the present invention.

FIG. 21 illustrates a CPU and cache that communicate using a flexible bridge. A CPU SCM 2100 and a cache SCM 2102 communicate with large bandwidth, large wireability, and low latency through the flexible bridge. The cache SCM 2102 connects via a cable to a memory unit that includes a memory controller and many memory chips. For instance, the cache chip offloads from the CPU the large circuits needed to communicate over the cable. The cache chip is relatively small, simple, and easy to fabricate, power, and cool in comparison to the large, complex CPU. In one embodiment of the present invention, the CPU SCM 2210 includes a narrow proximity communication array 2106 and the cache SCM 2102 includes a wide proximity communication array 2104.

Figure 22:
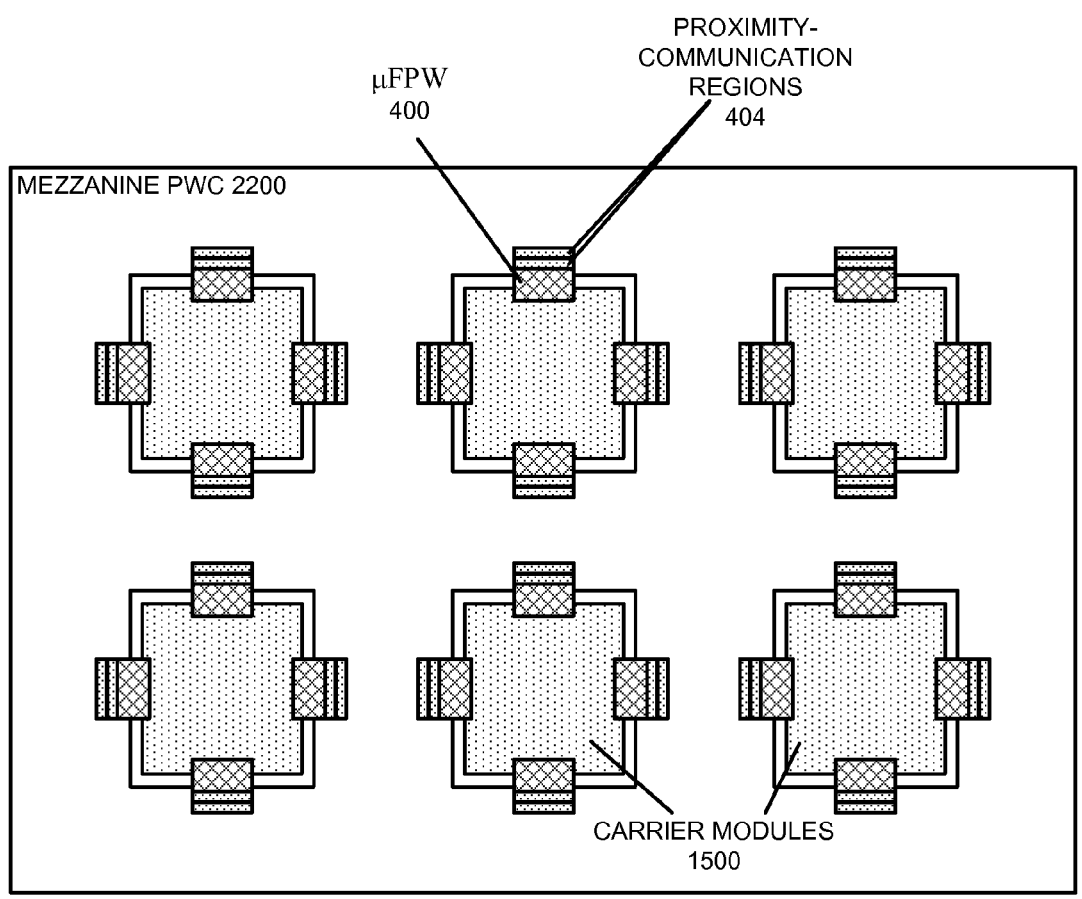
FIG. 22 illustrates a mezzanine printed-wiring card that links to an array of chips using flexible bridges in accordance with an embodiment of the present invention.

FIG. 22 illustrates a mezzanine PWC 2200 that links to an array of chips using flexible bridges. Multiple major chips are mounted on a set of carrier modules 1500 and connected through a substrate and large bonds to a PWB. The mezzanine PWC 2200 adds another wiring layer to the array. The carrier modules 1500 nestle through holes in the mezzanine PWC 2200, and connect to PxC regions 404 on the mezzanine using flexible bridges. Hence, the mezzanine provides communication connectivity that augments classical connectivity through the bottom of the modules, while allowing each major chip and SCM to be fabricated, assembled, tested, and yielded separately and independently. This structure allows SCM connectivity substantially similar to that of MCMs but without the bandwidth limitations of the PWB and large connectors.

In summary, a flexible bridge enables inter-chip communication with very high bandwidth, while relaxing alignment constraints, thereby transcending the wireability and bandwidth limits of conventional chip packaging technologies. Using a flexible bridge enhances communication between chips mounted on separate SCMs, and also allows each chip to be tested separately, thereby overcoming the yield problems of MCMs. The present invention allows multiple SCMs crudely mounted on a PWC to be re-mateably linked using PxC regions that provide very large bandwidth density, potentially enabling a simple and inexpensive PxC solution that can be applied to a wide range of electronic systems. Flexible bridges can provide a communication channel that allows modules to communicate without changing the scale of the interconnect from that on the chips and with reduced power consumption.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A system, comprising:
   a chip with an active face upon which active circuitry and signal pads reside;
   a second component with a surface upon which active circuitry and/or signal pads reside; and
   a flexible bridge that facilitates high-bandwidth proximity communication between the active face of the chip and the second component;
   wherein the flexible bridge comprises one or more proximity communication structures that are bonded to a section of micro flexible printed wiring; and
   wherein the wire line size in the flexible bridge matches the size of circuits and/or signal pads on the chip and on the second component, whereby signals can be sent between the circuits on the chip and the second component without having to change the scale of the interconnect, thereby alleviating wireability and bandwidth limitations of conventional chip packaging technologies.

2. The system of claim 1, wherein the flexible bridge provides a flexible connection that allows the chip to be moved with six degrees of freedom relative to the second component without affecting communication between the chip and the second component, whereby the flexible bridge allows the chip and the second component to communicate without requiring precise alignment between the chip and the second component.

3. The system of claim 1, wherein the flexible bridge is bonded conductively to the active face of the chip using micro-bumps.

4. The system of claim 1,
   wherein the flexible bridge includes a proximity-communication region that provides proximity communication functionality; and
   wherein the proximity-communication region is precisely aligned with a corresponding proximity-communication region on another component.

5. The system of claim 1,
   wherein the communication density of the flexible bridge is different for the active face of the first chip and the surface of the second component, and
   wherein the flexible bridge is tapered.

6. The system of claim 1,
   wherein an underfill is used when mounting the chip to another surface;
   wherein the underfill is adjusted to accommodate the flexible bridge; and
      where adjusting the underfill can further comprise fixing the flexible bridge in place.

7. The system of claim 1,
   wherein the flexible bridge does not interfere with a cooling system for the chip; and
   wherein heat is removed from the flexible bridge by transferring the heat to the chip, to the cooling system, and/or along the flexible bridge.

8. The system of claim 1, wherein the flexible bridge comprises metal traces on a silicon wafer from which the silicon has been etched away to leave a flexible metal layer.

9. The system of claim 8,
wherein the flexible bridge comprises multiple layers of metal traces and/or planes separated by dielectrics; and
wherein an enhanced thermal conductivity layer and/or plane can be used to assist in heat transfer.

10. The system of claim 1, wherein the flexible bridge is bonded to additional structures or wires that provide power delivery.

11. The system of claim 1, wherein the flexible bridge is fabricated using either additive or subtractive processes.

12. The system of claim 11, wherein the additive or subtractive processes leave circuit structures on the surface of the flexible bridge.

13. A method for manufacturing a flexible bridge, comprising:
creating metal traces on a wafer; and
etching away silicon on the wafer to leave a flexible metal layer of micro flexible printed wiring;
bonding the flexible metal layer of micro flexible printed wiring to one or more proximity communication structures to form the flexible bridge;
aligning the flexible bridge with an active face of a chip, wherein active circuitry and signal pads reside upon the active face of the chip;
aligning the flexible bridge with a second component upon which active circuitry and/or signal pads reside;
wherein the wire line size in the flexible bridge matches the size of circuits and/or signal pads on the chip and on the second component, whereby signals can be sent between the circuits on the chip and the second component without having to change the scale of the interconnect, thereby alleviating wireability and bandwidth limitations of conventional chip packaging technologies; and
wherein the flexible bridge facilitates high-bandwidth proximity communication between the chip and the second component.

14. The method of claim 13, wherein the method provides a flexible connection that allows the chip to be moved with six degrees of freedom relative to the second component without affecting communication between the chip and the second component, whereby the flexible bridge allows the chip and the second component to communicate without requiring precise alignment between the chip and the second component.

15. The method of claim 13, wherein the method further comprises bonding the flexible bridge conductively to the active face of the chip using micro-bumps.

16. The method of claim 13, wherein the method further involves bonding the flexible bridge to a second chip that provides proximity communication functionality.

17. The method of claim 13,
wherein the communication density of the flexible bridge is different for the active face of the first chip and the surface of the second component, and
wherein the flexible bridge is tapered.

18. The method of claim 13, wherein the metal traces are bonded to additional structures or wires that provide power delivery.

19. The method of claim 13, wherein the method further comprises fabricating the flexible bridge using either additive or subtractive processes.

20. A computer system that includes a flexible bridge, comprising:
a processor;
a memory; and
a flexible bridge;
wherein a chip includes an active face upon which active circuitry and signal pads reside;
wherein a second component includes a surface upon which active circuitry and/or signal pads reside;
wherein the flexible bridge facilitates high-bandwidth proximity communication between the active face of the chip and the second component,
wherein the flexible bridge comprises one or more proximity communication structures that are bonded to a section of micro flexible printed wiring; and
wherein the wire line size in the flexible bridge matches the size of circuits and/or signal pads on the chip and on the second component, whereby signals can be sent between the circuits on the chip and the second component without having to change the scale of the interconnect, thereby alleviating wireability and bandwidth limitations of conventional chip packaging technologies.

* * * * *

UNITED STATES PATENT AND TRADEMARK OFFICE
CERTIFICATE OF CORRECTION

PATENT NO. : 7,649,245 B2 Page 1 of 1
APPLICATION NO. : 11/418985
DATED : January 19, 2010
INVENTOR(S) : Zingher et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 656 days.

Signed and Sealed this

Twenty-third Day of November, 2010

David J. Kappos
*Director of the United States Patent and Trademark Office*